(12) United States Patent
Morgan et al.

(10) Patent No.: US 12,158,783 B1
(45) Date of Patent: Dec. 3, 2024

(54) COMPUTE DEVICE HOUSING WITH LAYERS OF ELECTROMAGNETIC INTERFERENCE SHIELDS, AND DEVICES AND SYSTEMS FOR THE SAME

(71) Applicant: Management Services Group, Inc., Virginia Beach, VA (US)

(72) Inventors: Thomas Scott Morgan, Virginia Beach, VA (US); Brian Lee Yonker, Virginia Beach, VA (US)

(73) Assignee: Management Services Group, Inc., Virginia Beach, VA (US)

( * ) Notice: Subject to any disclaimer, the term of this patent is extended or adjusted under 35 U.S.C. 154(b) by 0 days.

(21) Appl. No.: 18/316,516

(22) Filed: May 12, 2023

Related U.S. Application Data

(63) Continuation of application No. 17/714,421, filed on Apr. 6, 2022, now Pat. No. 11,687,129, which is a continuation of application No. 16/944,992, filed on Jul. 31, 2020, now Pat. No. 11,307,622, which is a continuation of application No. 16/895,880, filed on Jun. 8, 2020, now Pat. No. 10,775,856.

(60) Provisional application No. 62/942,372, filed on Dec. 2, 2019.

(51) Int. Cl.
*H05K 9/00* (2006.01)
*G06F 1/18* (2006.01)

(52) U.S. Cl.
CPC ........... *G06F 1/182* (2013.01); *H05K 9/0032* (2013.01); *H05K 9/0081* (2013.01)

(58) Field of Classification Search
CPC .................... H05K 9/0032; H05K 9/0081

USPC ................................ 361/816, 818
See application file for complete search history.

(56) References Cited

U.S. PATENT DOCUMENTS

| | | |
|---|---|---|
| 5,165,055 A | 11/1992 | Metsler |
| 5,323,299 A | 6/1994 | Weber |
| 5,777,856 A | 7/1998 | Phillips et al. |
| 6,138,347 A | 10/2000 | Persson et al. |
| 6,617,686 B2 * | 9/2003 | Davies ............... H01L 23/552 257/725 |
| 6,979,774 B2 | 12/2005 | Abe et al. |
| 8,077,479 B2 | 12/2011 | Ligtenberg |

(Continued)

FOREIGN PATENT DOCUMENTS

| | | |
|---|---|---|
| DE | DD-298987 A5 | 3/1992 |
| WO | WO-9114354 A1 | 9/1991 |
| WO | WO-0077907 A1 | 12/2000 |

*Primary Examiner* — Hung S. Bui
(74) *Attorney, Agent, or Firm* — COOLEY LLP

(57) ABSTRACT

In some embodiments an apparatus includes a housing that defines an interior. The apparatus includes a first circuit board that has multiple integrated circuits (ICs). The first circuit board is disposed within the interior of the housing. The apparatus includes a second circuit board that has multiple ICs. The second circuit board is also disposed within the interior of the housing. The apparatus further includes a first electromagnetic interference (EMI) shield disposed about an IC from the multiple ICs of the first circuit board and not disposed about remaining ICs from the multiple ICs of the first circuit board. The apparatus further includes a second EMI shield disposed about the first circuit board and not the second circuit board. The apparatus further includes a third EMI shield disposed about the first circuit board and the second circuit board.

20 Claims, 5 Drawing Sheets

(56) References Cited

U.S. PATENT DOCUMENTS

| | | |
|---|---|---|
| 8,164,170 B2 | 4/2012 | Ellis |
| 9,642,293 B2 | 5/2017 | Duthilleul |
| 9,922,937 B2 | 3/2018 | Kuhlman |
| 10,775,856 B1 | 9/2020 | Morgan et al. |
| 11,307,622 B1 | 4/2022 | Morgan et al. |
| 2001/0033478 A1 | 10/2001 | Ortiz et al. |
| 2003/0085050 A1 | 5/2003 | Zarganis et al. |
| 2012/0236528 A1 | 9/2012 | Le et al. |
| 2016/0064337 A1 | 3/2016 | Chen et al. |
| 2016/0313454 A1 | 10/2016 | Rodrigues et al. |
| 2018/0310440 A1 | 10/2018 | Hunt et al. |
| 2019/0029147 A1 | 1/2019 | Cordes |
| 2019/0036191 A1 | 1/2019 | Huang et al. |
| 2019/0045674 A1* | 2/2019 | Liang ............ H05K 1/181 |
| 2019/0244831 A1 | 8/2019 | Candler et al. |
| 2020/0029474 A1 | 1/2020 | Hawn |
| 2020/0344924 A1 | 10/2020 | Harrigan |

\* cited by examiner

COMPUTE DEVICE HOUSING WITH LAYERS OF ELECTROMAGNETIC INTERFERENCE SHIELDS, AND DEVICES AND SYSTEMS FOR THE SAME

CROSS REFERENCE TO RELATED APPLICATION

This application is a continuation of U.S. application Ser. No. 17/714,421, filed Apr. 6, 2022, entitled "Compute Device Housing With Layers Of Electromagnetic Interference Shields, And Devices And Systems For The Same", which is a continuation of U.S. application Ser. No. 16/944,992, filed Jul. 31, 2020, entitled "Compute Device Housing With Layers Of Electromagnetic Interference Shields, And Devices And Systems For The Same", now U.S. Pat. No. 11,307,622, which is a continuation application of U.S. application Ser. No. 16/895,880, filed Jun. 8, 2020, entitled "Compute Device Housing With Layers Of Electromagnetic Interference Shields, And Devices And Systems For The Same", now U.S. Pat. No. 10,775,856, which claims priority to and the benefit of U.S. Patent Application No. 62/942,372, filed Dec. 2, 2019 and entitled "Radio Frequency Filter," each of which is incorporated herein by reference in its entirety.

TECHNICAL FIELD

The present disclosure relates to the field of electromagnetic interference shields, and in particular to apparatus, devices, and systems related to a compute device housing, in which the compute device housing and electronic circuits inside the compute device housing are shielded using layers of electromagnetic interference shields.

BACKGROUND

Electronic circuitry including integrated circuits or power systems in computers and embedded systems can generate electromagnetic waves that can induce undesired electromagnetic effects to other electronic circuitry of the computers and embedded systems, and even can induce undesired electromagnetic effects outside of the computers and embedded systems. Thus, a need exists for an electromagnetic interference shielding that improves reliability and security of the computers or embedded computers.

SUMMARY

In some embodiments an apparatus includes a housing that defines an interior. The apparatus includes a first circuit board that has multiple integrated circuits (ICs). The first circuit board is disposed within the interior of the housing. The apparatus includes a second circuit board that has multiple ICs. The second circuit board is also disposed within the interior of the housing. The apparatus further includes a first electromagnetic interference (EMI) shield disposed about an IC from the multiple ICs of the first circuit board and not disposed about remaining ICs from the multiple ICs of the first circuit board. The apparatus further includes a second EMI shield disposed about the first circuit board and not the second circuit board. The apparatus further includes a third EMI shield disposed about the first circuit board and the second circuit board.

DETAILED DESCRIPTION

Figure 1:
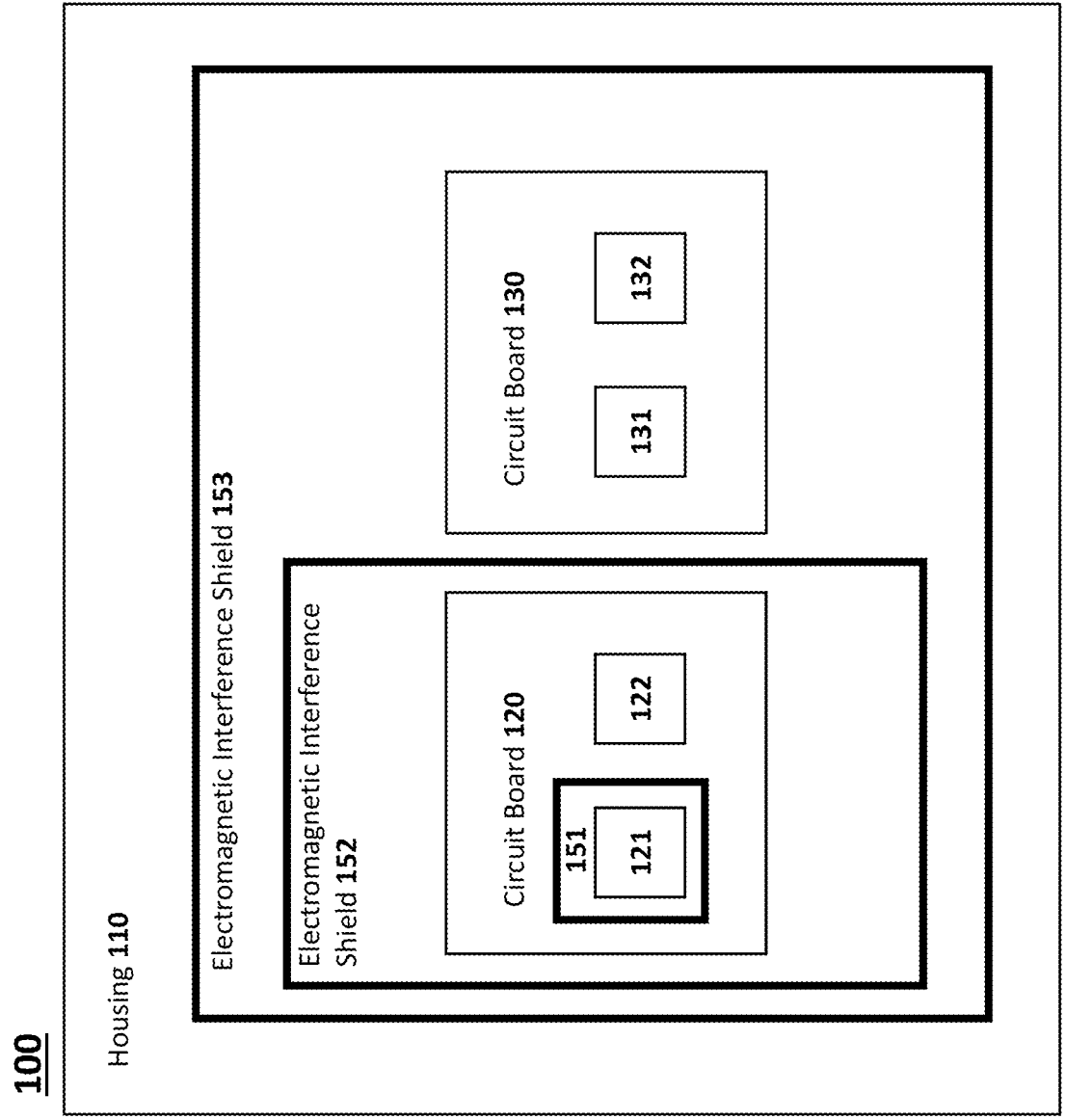
FIG. 1 is a block diagram that illustrates an integrated circuit shielding system, according to an embodiment.

Non-limiting examples of various aspects and variations of the embodiments are described herein and illustrated in the accompanying drawings.

One or more embodiments described herein generally relate to apparatus and systems that use a set of electromagnetic interference (EMI) shields to shield a set of integrated circuits (ICs) within an integrated circuit shielding system. Generally speaking, operating a first electronic circuit of a compute device, ranging from small embedded electronic devices to large electronic systems, can generate unintended electromagnetic waves such as, for example, radio frequency waves, microwaves, and/or the like. Such unintended electromagnetic waves generated by the first electronic circuit can induce undesired electromagnetic effects on a second electronic circuit of the compute device and/or information crosstalk between the first electronic circuit, the second electronic circuit, and/or to a third electronic circuit outside the compute device. Such undesired electromagnetic effects and/or information crosstalk can pose degraded performance of the electronic circuit and information security, and can be reduced or prevented using the integrated circuit shielding system described herein.

Described herein are examples of integrated circuit shielding systems (also referred to herein as "electronic shielding systems") that are suitable for highly reliable and secure computing systems. One or more integrated circuit shielding systems described herein achieve high performing integrated circuit shielding, circuit board shielding, and/or electronic device shielding that collectively protect the integrated circuits, circuit boards, and/or electronic devices disposed in the one or more integrated circuit shielding systems from a wide range of potential electromagnetic interference events. The potential electromagnetic interference events can include, for example, events at different frequencies such as radio frequencies, microwave frequencies, and/or the like.

One or more integrated circuit shielding systems described herein are used to separate, via layers of interference filters, electronic components (including integrated circuits and circuit boards) disposed within a chassis of the one or more integrated circuit shielding systems. Separating the electronic components by layers of interference filters reduces or eliminates undesired crosstalk between the electronic components and potential inadvertent propagation of information between the electronic components and/or the outside of the one or more integrated circuit shielding systems.

Electromagnetic interference (EMI) shielding performance of an electronic shielding system described herein depends at least in part on individual EMI shielding of each electronic component (e.g., an integrated circuit (IC), a circuit board, and/or the like) disposed within the electronic shielding system. Having a shield located as close as possible to a source of an unintended EMI radiation can reduce higher harmonic frequencies (also referred to herein as "harmonics") of the unintended EMI radiation and protect individual electronic components. This is in contrast to having a catch-all electromagnetic filter with a broadband electromagnetic response that essentially cannot prevent an EMI radiation originated within the electronic system from negatively impacting an electronic component disposed also within the electronic shielding system. Moreover, relying solely on individual EMI shielding of each electronic component cannot, in some instances, account for a collective generation of EMI radiations by multiple electronic components or, in some instances, harmonics that are not fully blocked by individual EMI shields. Therefore, a multi-layer approach with a layer of an EMI shield(s) to shield EMI radiations by integrated circuits, a layer of an EMI shield(s) to shield EMI radiations by circuit boards, and a layer of an EMI shield(s) to shield all possible remaining EMI radiations can be most effective as described herein.

FIG. 1 is a block diagram that illustrates an integrated circuit shielding system 100, according to an embodiment. The integrated circuit shielding system 100 includes a housing 110 that defines an interior of the housing 110. The housing 110 of the integrated circuit shielding system 100 is a housing that helps to protect, mechanically support, and/or house various electronic components that make up the integrated circuit shielding system 100.

A set of circuit boards 120, 130, and a set of electromagnetic interference (EMI) shields 151, 152, 153 (e.g., a part of a Faraday cage, a gasket, and/or the like) are disposed within the interior of the housing 110. Additional electronic components such as for example, a cooling fan, a thermal management device, a power supply, and/or the like (not shown) can also be disposed within the interior of the housing 110. In some implementations, a host board (e.g., a motherboard; not shown) that hosts various electronic components (e.g., the set of circuit boards 120, 130) and the EMI shields 151, 152, 153 of the integrated circuit shielding system 100 can also be disposed within the housing 110.

The set of circuit boards 120, 130 are boards that can mechanically support and electrically interconnect electrical components (e.g., a capacitor(s), a resistor(s), an inductor(s), and/or the like) and/or electronic components (transistors, light emitting diodes, logic gate circuit, and/or the like). Each circuit board 120, 130 can further include conductive tracks (copper tracks, aluminum tracks, silver tracks, and/or the like), conductive sheets (copper sheets, aluminum sheets, and/or the like), insulating sheets (e.g., porcelain sheets, mica sheets, plastic sheets, and/or the like), and/or the like. Each circuit board from the set of circuit boards 120, 130 can be connected (without intervening components) or operatively coupled (with or without intervening components) to the remaining circuit boards from the set of circuit boards 120, 130. Each circuit board 120, 130 can provide at least one specialized function such as, for example, computing, graphic processing, storage, networking, and/or the like. The set of circuit boards 120, 130 include a set of integrated circuits (ICs) 121,122,131,132 that collectively perform the at least one specialized function. In some instances, each circuit board 120, 130 can perform multiple functions such as, for example, computing and storage, graphic processing and networking, storage and graphic processing, and/or the like. Although only two circuit boards 120, 130 and four sets of ICs 121,122,131,132 are shown in FIG. 1, it should be understood that this is only for convenience and a greater number of circuit boards and sets of ICs are possible.

Each IC 121, 122, 131, 132 typically integrates a large number (e.g., thousands, millions, and/or the like) of electronic components (e.g., metal-oxide-semiconductor (MOS) transistors, charged-coupled optical sensor, floating-gate memory cell, and/or the like) on a flat piece of semiconductor (e.g., silicon, germanium, gallium arsenide, and/or the like), insulator (silicon oxide, silicon nitride, aluminum nitride, and/or the like), and/or conductor (silver, copper, indium tin oxide, and/or the like). The set of ICs 121, 122, 131, 132 can be configured to perform, for example, control procedures, arithmetic procedures, logical procedures, signal generation procedures, signal communication procedures, electronic charge storage procedures, and/or the like.

In some instances, an IC from the set of ICs 121, 122, 131, 132 can include a processor. The processor can include, for example, a general purpose processor, a graphical processing unit, an application specific integrated circuit (ASIC), a field programmable gate array (FPGA), an accelerated processing unit (APU), a programmable logic controller (PLC), a microcontroller, and/or the like.

In some instances, an IC from the set of ICs 121, 122, 131, 132 can include a memory. The memory can include an electronic circuitry, a magnetic disk, and/or an optically encoded disk. The memory can be configured to be operatively coupled to the processor. The memory can include, for example, a memory buffer, a random access memory (RAM), a read-only memory (ROM), a hard drive, a flash drive, a secure digital (SD) memory card, a compact disk (CD), an external hard drive, an erasable programmable read-only memory (EPROM), an embedded multi-time programmable (MTP) memory, an embedded multi-media card (eMMC), a universal flash storage (UFS) device, and/or the like.

In some instances, an IC from the set of ICs 121, 122, 131, 132 can include a communication module. The communication module can enable the IC to communicate with (e.g., send data to and/or receive data from) the remaining ICs and/or external compute device via a wired connection and/or a wireless communication. In some implementations, the communication module can include a set of transmitter antennas and/or a set of receiver antennas to enable the wireless communication (e.g., a WiFi™ wireless communication, a $5^{th}$ generation (5G) wireless communication, a satellite communication, and/or the like). In some implementations, the communication interface can establish and/or maintain a communication session between the housing 110 and an external compute device (e.g., via a computer network or the internet, not shown).

In some implementations, the set of ICs 121, 122, 131, 132 are connected (without intervening components) or operatively coupled (with or without intervening components) to the remaining ICs from the set of ICs 121, 122, 131, 132. For example, a processor IC can be operatively coupled to a memory IC via an address bus, a data bus, a control bus, and/or the like (not shown). In some implementations, ICs (e.g., ICs 121, 122) included on a circuit board (e.g., circuit board 120) are operatively coupled together but are not operatively coupled to the remaining ICs (e.g., ICs 131, 132) included in the remaining circuit boards (e.g., circuit boards 130).

The set of electromagnetic interference (EMI) shields 151, 152, 153 are disposed within the interior of the housing 110 of the integrated circuit shielding system 100. The set of EMI shields 151, 152, 153 can include, for example, a part of a Faraday cage, an EMI gasket, and/or the like. The set of EMI shields 151, 152, 153 can be made of continuous sheets of conductive materials (copper, aluminum, ferrite, MuMETAL™, Mylar blanket, and/or the like), patterned materials (metallic mesh, dielectric metamaterials, conductive foams, and/or the like), and/or any material systems that are resistant to electromagnetic field penetration. The set of EMI shields 151, 52, 153 are configured to shield, for example, a set of frequency harmonics (also referred to herein as 'harmonics') of an electromagnetic wave (e.g., a radio frequency (RF) wave) generated within the interior of the housing 110. The set of EMI shields are disposed about a subset of ICs (e.g., IC 121 and/or ICs 121, 131) from the set of ICs 121, 122, 131, 132, a subset of circuit boards (e.g., circuit board 120 and/or circuit board 130) from the set of set of circuit boards 120, 130.

In some embodiments, the integrated circuit shielding system 100 can include a set of compute devices (not shown) and/or to a set of peripheral devices (not shown) communicatively and/or operatively coupled to the housing 110 of the integrated circuit shielding system 100. The set of compute devices can be outside the interior of the housing 110 and can receive a set of signals from the set of circuit boards 120, 130. The set of compute devices can perform an action (e.g., a communication, a remedial action, a computing action, a storage action, and/or the like) in response to receiving the set of signals from the set of circuit boards 120, 130. The set of compute devices can include, for example, a CPU, a memory, a GPU, a WiFi™ module, and/or the like. The set of peripheral devices can be communicatively and/or operatively coupled to the housing 110 of the integrated circuit shielding system 100. The set of peripheral devices can be set of ancillary devices used to input information to the set of circuit boards 120, 130 of the housing 110 or output information from the set of circuit boards 120, 130 of the housing 110. The set of peripheral devices can include, for example, a keyboard(s), a mouse(s), a monitor(s), a webcam(s), a microphone(s), a touch screen(s), a printer(s), a scanner(s), a virtual reality (VR) head-mounted display, a speaker(s), a headphone(s), a gamepad(s), a joystick(s), a biometric reader(s), and/or the like (not shown).

As shown in FIG. 1, the integrated circuit shielding system 100 includes a first electromagnetic interference (EMI) shield 151 (e.g., a part of a Faraday cage, a gasket, and/or the like) disposed about an IC 121 disposed on the first circuit board 120 and not disposed about the remaining IC 122 on the first circuit board 120. The first EMI shield 151 is disposed about the IC 121 in the sense that the first EMI shield 151 at least partially surrounds the IC 121 in a three dimensional space around the IC 121 (e.g., partially surround on at least two sides of the IC 121 with a non-planar shape). The first EMI shield 151 can work in conjunction with another shielding component(s) to collectively and completely surround the IC 121. Although not shown in FIG. 1, another EMI shield can be disposed about IC 122 and not IC 121 (similar to first EMI shield 151), and also can work in conjunction with another shielding component(s) to collectively and completely surround IC 122. The other shield component(s) with which the first EMI shield 151 and the EMI shield disposed about IC 122 works can be a common shield component(s) or separate shield component(s). Each of the first EMI shield 151 and the EMI shield disposed about IC 122 can be physically connected and/or operatively coupled to the other shielding component(s), for example, by solder, spring tension, and/or a constant force applied by compression from another component of system 100.

The integrated circuit shielding system 100 includes a second EMI shield 152 (e.g., a part of a Faraday cage, a gasket, and/or the like) disposed about the first circuit board 120 and not the second circuit board 130. Moreover, the second EMI shield 152 is disposed about the first EMI shield 151. The second EMI shield 152 is disposed about circuit board 120 in the sense that the first EMI shield 152 at least partially surrounds the circuit board 120 in a three dimensional space around the circuit board 120 (e.g., partially surround on at least two sides of the circuit board 120 with a non-planar shape). The second EMI shield 152 can work in conjunction with another shielding component(s) to collectively and completely surround the first circuit board 120. Although not shown in FIG. 1, another EMI shield can be disposed about circuit board 130 and not circuit board 120 (similar to second EMI shield 152), and also can work in conjunction with another shielding component(s) to collectively and completely surround circuit board 130. The other shield component(s) with which the second EMI shield 152 and the EMI shield disposed about circuit board 130 works can be a common shield component(s) or separate shield component(s). Each of the second EMI shield 152 and the EMI shield disposed about circuit board 130 can be physically connected and/or operatively coupled to the other shielding component(s), for example, by solder, spring tension, and/or a constant force applied by compression from another component of system 100.

The integrated circuit shielding system 100 further includes a third EMI shield 153 (e.g., a part of a Faraday cage, a gasket, and/or the like) disposed about the first circuit board 120 and the second circuit board 130. The third EMI shield 153 is disposed about the first circuit board 120 and the second circuit board 130 in the sense that the third EMI shield 153 at least partially surrounds the first circuit board 120 and the second circuit board 130 in a three dimensional space around the first circuit board 120 and the second circuit board 130 (e.g., partially surround on at least two sides of the first and second circuit boards 120, 130 with a non-planar shape). Moreover, the third EMI shield 153 is disposed about the second EMI shield 152 and the first EMI shield 151. The third EMI shield 153 can work in conjunction with another shielding component(s) to collectively and completely surround the first circuit board 120 (and can be physically and/or operatively coupled to the other shielding component(s) as described above in connection with the first EMI shield 151 and the second EMI shield 152). The first EMI shield, the second EMI shield, and the third EMI shield are collectively configured to shield a harmonic EMI sent by the IC 121, a harmonic EMI generated by the first circuit board 120, and a harmonic EMI collectively generated by the first circuit board 120 and the second circuit board 130, respectively. Although not explicitly shown for simplicity, it should be understood that a separate EMI shield can be disposed about each of ICs 122, 131, 132, and yet another separate EMI shield can be disposed about circuit board 130 so that each IC undergoes three layers of EMI protection: one at the chip level, one at the circuit board level, and one at the overall housing level.

In some implementations, the first EMI shield 151 surrounds the IC 121 on all sides but one and is mounted on the first circuit board 120. In such implementations, the first EMI shield 151 surrounds the IC 121 from the lateral sides of the IC 121 and on the top side of the IC 121, but not at the bottom side of the IC 121 where it is mounted on the first circuit board 120. The bottom side of the IC 121 mounted on the first circuit board 120 can be made of a printed circuit board (PCB) material that serves as an EMI shield and collectively with the first EMI shield 151 define a Faraday cage. The Faraday cage fully surrounds the IC 121 in a three dimensional space around the IC 121. In some implementations, the first EMI shield 151 includes a first portion that surrounds the IC 121 on all sides but one and a second portion that corresponds to at least a portion of the first circuit board 120 so that there is no intervening structure between the first EMI shield 151 and the IC 121. In one example, the EMI shield 151 can be directly and conformally deposited on the IC 121 such that there is no air gap between the EMI shield 151 and the IC 121. In another example, the EMI shield 151 can be directly and conformally deposited on a dielectric encapsulation layer covering the IC 121. In yet another example, the EMI shield 151 can be fabricated separately and placed on and/or about the IC 121 using a micro-positioner such that the EMI shield 151 surrounds the IC 121 with an air gap between the EMI shield 151 and the IC 121.

In some implementations, the second EMI shield 152 is included within (or is a part of) a Faraday cage that completely surrounds the first circuit board 120 in a three dimensional space around the first circuit board 120. In some instances, the first circuit board 120 and/or the second circuit board 130 can be formed from or mounted, from the bottom sides, on top of a PCB board made of a PCB material that serves as an EMI shield. The second EMI shield 152 collectively with the PCB board at the bottom side of the first circuit board 120 can define the Faraday cage.

In some implementations, the third EMI shield 153 is included within (or is a part of) a Faraday cage that completely surrounds the first circuit board 120 and the second circuit board 130. The third EMI shield 153 can further include or be coupled to an EMI gasket. The third EMI shield 153 collectively with the EMI gasket can collectively define the Faraday cage that surrounds the first circuit board 120 and the second circuit board 130 in a three dimensional space around the first circuit board 120 and the second circuit board 130. The third EMI shield 153 can be a chassis for the entire system 100. For example, the third EMI shield 153 as a chassis can be made from a single part or from multiple parts collectively grounded, so that a harmonic EMI is shielded.

In some configurations, the first EMI shield 151 is configured or optimized to primarily shield a third harmonic EMI sent by the IC 121 during operation of the IC 121. The second EMI shield 152 is configured or optimized to primarily shield a fifth harmonic EMI sent by the ICs 121, 122 and indirectly by the first circuit board 120 during operation (e.g., via a trace(s) of the first circuit board 120 during operation of the ICs 121, 122). The third EMI shield 153 is configured or optimized to primarily shield a seventh harmonic EMI sent by the ICs 121, 122, 131, 132, and indirectly the first circuit board 120 and the second circuit board 130 during operation (e.g., via a trace(s) of the first circuit 120 during operation of the ICs 121, 122 or a trace(s) of the second circuit board 130 during operation of the ICs 131, 132).

In some implementations, a selective shielding of a specific harmonic EMI (e.g., a third harmonic, a fifth harmonic, a seventh harmonic, and/or the like) can be achieved by patterning (or forming) the set of EMI shields 151, 152, 153 with a set of apertures (e.g., circular holes, rectangular holes, elliptical holes, and/or the like). In one example, the radius of a circular aperture of an EMI shield can be based on a cutoff frequency $f_c$ of the EMI shield. In another example, the longest dimension of a rectangular aperture of an EMI shield can be based on a cutoff frequency $f_c$ of the EMI shield. In some instances, to achieve an excellent shielding performance (e.g., over 90% shielding, over 99% shielding, and/or the like) in an EMI shield for the specific harmonic EMI, a longest dimension of apertures in the EMI shield can be kept at or smaller than a fraction (e.g., 1/20, 1/50, and/or the like) of the EMI wavelength of the specific harmonic EMI.

In some implementations, a selective shielding of a specific harmonic EMI can be achieved by configuring or optimizing the set of EMI shields 151, 152, 153 with a thickness at or larger than an effective skin depth of a set of constituent materials of the set of EMI shields 151, 152, 153. In one example, an EMI shield can be made of a continuous copper sheet having a skin depth of about 65 μm for an electromagnetic radiation with 1 MHz frequency.

In some implementations, a selective shielding of a specific harmonic EMI can be achieved by configuring or optimizing the set of EMI shields 151, 152, 153 (e.g., using analytical or numerical models) with a combination of material thicknesses and patterned apertures. The set of EMI shields 151, 152, 153 can be configured/optimized to have a band-pass response. The band-pass response can reduce/block the specific harmonic of EMI while permitting propagation of another electromagnetic wave.

In some instances, harmonics of a set of interferences at frequencies less than and including a frequency associated with the seventh harmonic of the interference due to operation of the IC 121 are dominant (i.e., have larger amplitudes than the amplitudes at higher frequencies). In such instances, the first EMI shield, the second EMI shield, and the third EMI shield are collectively configured to shield interference (1) of electronic components within the interior of the housing and (2) at frequencies less than and including a frequency associated with the seventh harmonic of the interference during operation of the electronic components within the interior of the housing.

Selective shielding of specific harmonic EMIs about a set of EMI sources (e.g., the set of ICs 121, 122, 131, 132 and/or the set of circuit boards 120, 130) can be performed near the set of EMI sources. Such selective shielding of a harmonic EMI near an EMI source can reduce or prevent the otherwise generation of higher harmonics of the harmonic EMI upon interaction of the harmonic EMI with surroundings of the EMI source. Moreover, selective shielding of a specific harmonic EMI about a first EMI source disposed within the housing 110 can reduce or prevent a potential negative or unintentional impact of the first EMI source on another EMI source(s) also disposed within the housing 110. Although in some implementations the EMI shield 153 can be configured or optimized to have a broadband response to include shielding effect for EMIs at multiple frequencies including a third EMI harmonic, a fifth EMI harmonic or a seventh EMI harmonic, it is generally desirable to selectively shield each EMI harmonic near the EMI source.

In one example, an IC 121 of the integrated circuit shielding system 100 includes a processing unit (not shown) that generates a set of clock signals (e.g., electrical signals) for synchronized operation of a set of arithmetic operations of the processing unit. Besides the set of clock signals, the IC also radiates a (parasitic) electromagnetic interference, for example, due to alternating current flowing in a circuitry of the IC. The electromagnetic interference generated at the IC can radiate in every direction and in high frequency (HF) band, very high frequency (VHF) band, ultra-frequency (UF) band, and/or a frequency in the same order of the clock speed. The spectral features of the electromagnetic interference includes a set of odd harmonics and/or a set of even harmonics, where the set of odd harmonics are more pronounced than the set of even harmonics. The set of EMI shields of the can be configured to shield the set of odd harmonics such as, for example, a third harmonic of electromagnetic interference, a fifth harmonic of electromagnetic interference, a seventh harmonic of electromagnetic interference, and/or the like.

In some embodiments, a fourth EMI shield can be disposed about the second circuit board 130 and not be disposed about the first circuit board 120. The second EMI shield 152 and the fourth EMI shield disposed around the first circuit board 120 and the second circuit board 130, respectively, can define continuous ground planes for the first circuit board 120 and the second circuit board 130. The second EMI shield 152 and the fourth EMI shield can define the continuous ground planes by connecting, via conductive material (e.g., a composite material with metallic stands), to a grounded material. In one example, the grounded material can be electrically connected to a power supply disposed within the interior of the housing 110.

Figure 2:
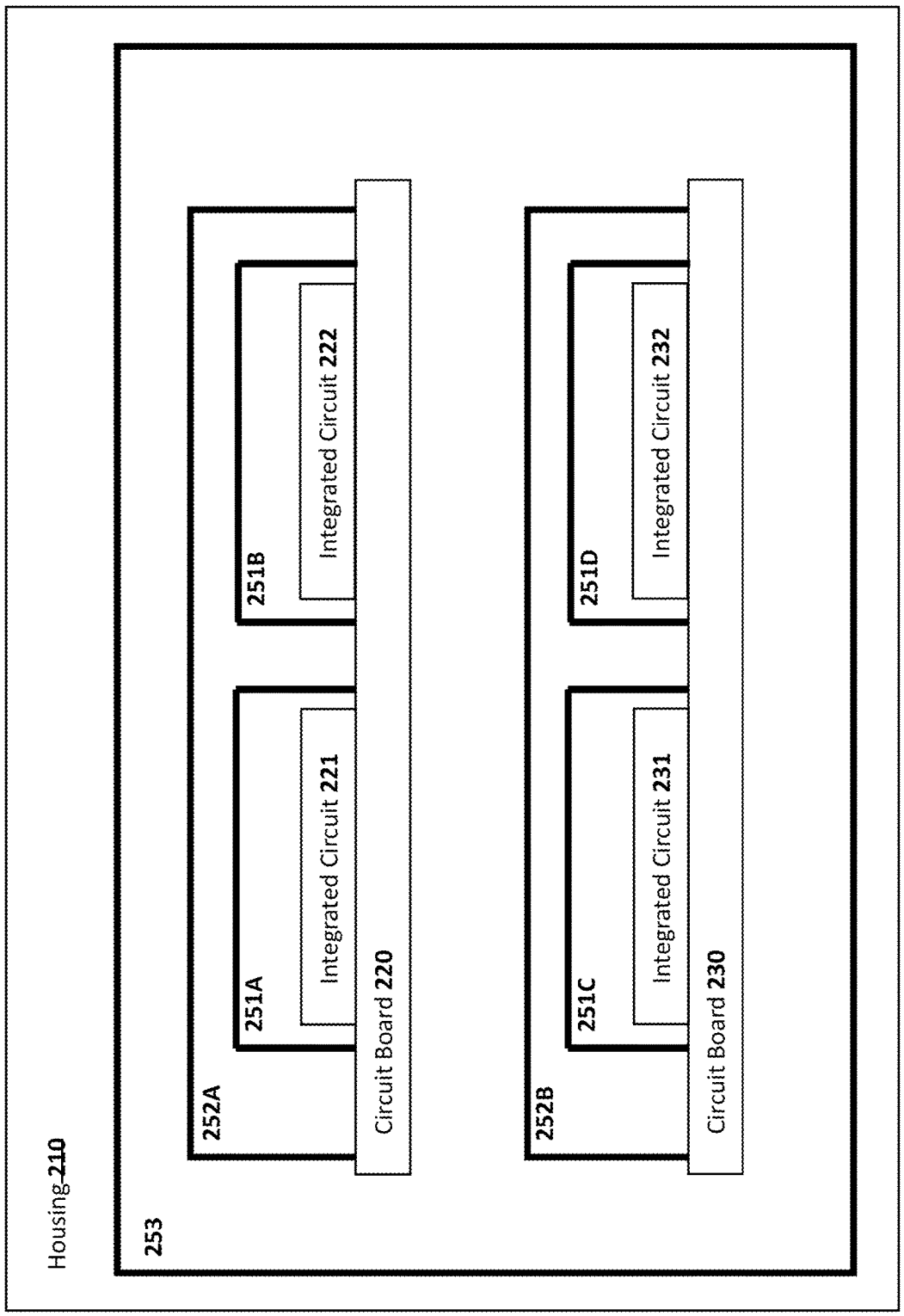
FIG. 2 is a schematic side view of an integrated circuit shielding system, according to an embodiment.

FIG. 2 is a schematic side view of an integrated circuit shielding system 200, according to an embodiment. As shown in FIG. 2, an integrated circuit shielding system 200 includes a housing 210 that defines an interior. A first circuit board 220 and a second circuit board 230 are disposed within the interior of the housing 200. The first circuit board 220 and the second circuit board 230 include a set of integrated circuits (ICs) 221, 222, 231, 232 that are also disposed within the interior of the housing 210. The first circuit board 220 includes ICs 221, 222 and the second circuit board 130 includes ICs 231, 232. Each circuit board 220, 230 and each IC 221, 222, 231, 232 are individually and/or collectively shielded by an electromagnetic interference (EMI) shield from a set of EMI shields 251A, 251B, 251C, 251D, 252A, 252B, 253 (e.g., a part of a Faraday cage, a gasket, and/or the like) disposed within the interior of the housing 210 and about the IC 221, 222, 231 and the circuit board 220, 230. Each EMI shield 251A, 251B, 251C, 251D, 252A, 252B, 253 can be configured to shield a harmonic EMI generated by an IC from the set of ICs 221, 222, 231, 232 and/or a harmonic EMI generated by the first circuit board 220 and/or the second circuit board 230.

Each IC from the set of ICs 221, 222, 231, 232 is electromagnetically shielded by EMI shields 251A, 251B, 251C, 251D, respectively. Each EMI shield 251A, 251B, 251C, 251D surrounds an IC 221, 222, 231, 232, respectively on all sides but one. For example, the EMI shield 251A surrounds the IC 221 from the lateral sides and on the top side of the IC 221, but not from the bottom side of the IC 121 where it is mounted on the first circuit board 220. In some implementations, each EMI shield 251A, 251B, 251C, 251D surrounds an IC 221, 222, 231, 232, respectively, on all sides but one such that there is no intervening structure between the EMI shield 251A, 251B, 251C, 251D and the IC 221, 222, 231, 232, respectively. In one example, an EMI shield 251A can be directly disposed on the IC 221 such that there is no air gap between the EMI shield 251A and the IC 221. In another example, the EMI shield 251A can be directly and conformally deposited on a dielectric encapsulation layer covering the IC 221.

Each circuit board 220, 230 disposed in the interior of the housing 210 of the integrated circuit shielding system 200 is electromagnetically shielded by an EMI shield from a second subset of EMI shields 252A, 252B. The EMI shield 252A, 252B surrounds the circuit boards 220, 230, respectively, on all sides but one. For example, the EMI shield 252A surrounds the circuit board 220 from the lateral sides and on the top side of the circuit board 220, but not from the bottom side of the circuit board 220 where it can be mounted on an interior surface of the housing 210, a mechanical support disposed in the interior of the housing 210, a motherboard disposed in the interior of the housing 210, and/or the like. The first circuit board 220 and the second circuit board 230 (and the ICs mounted thereon) are electromagnetically shielded by an EMI shield 253, encompassing the first circuit board 220 and the second circuit board 230 from all sides. In some alternative embodiments, the first circuit board and the second circuit board can be electromagnetically shielded by the EMI shield surrounding the first circuit board and the second circuit board on all sides but one.

In some implementations, the top surface of the first circuit board 220 and/or the second circuit board 230 can be made of printed circuit board (PCB) materials that serve as EMI shields. Each EMI shield 251A, 251B, 251C, 251D includes a first portion that surrounds each IC 221, 222, 231, 232, respectively, on all sides but one and a second portion that corresponds to at least a portion (the top surface) of the first circuit board 220 and/or the second circuit board 230 so that no intervening structure is disposed between the first EMI shield and the IC. The first portion and the second portion of each EMI shield can collectively define a Faraday cage that fully surrounds each IC 221, 222, 231, 232 in a three dimensional space around each IC 221, 222, 231, 232.

Figure 3:
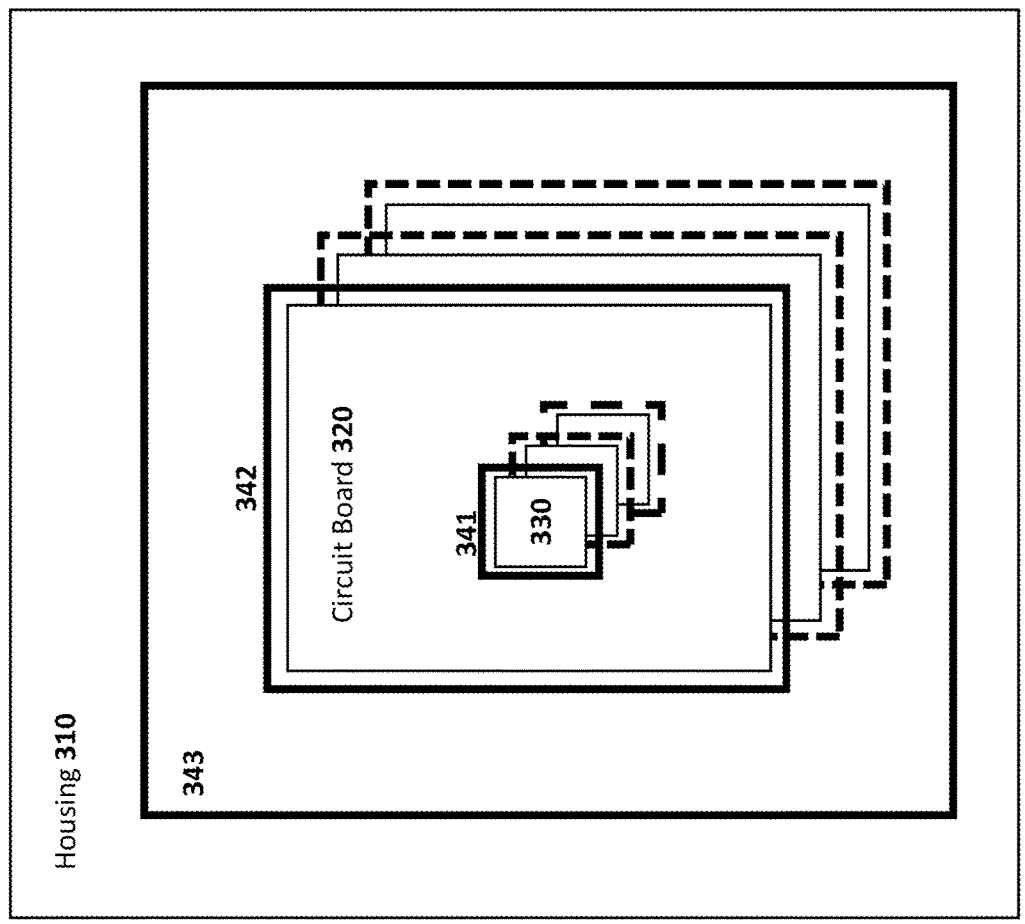
FIG. 3 is a block diagram that illustrates an integrated circuit shielding system, according to an embodiment.

FIG. 3 is a block diagram that illustrates an integrated circuit shield system 300, according to an embodiment. The integrated circuit shield system 300 includes a housing 310 and a set of circuit boards 320. The integrated circuit shield system 300 further includes a first set of EMI shields 341 disposed about a uniquely associated IC from a set of ICs 330 of the set of circuit boards 320 and not disposed about each remaining IC from the plurality of ICs 330. The integrated circuit shield system 300 further includes a second set of EMI shields 342, each EMI shield from the second set of EMI shields disposed about a uniquely associated circuit board from the set of circuit boards 320 and not disposed about each remaining circuit board from the set of circuit boards 320. The integrated circuit shield system 300 further includes a third EMI shield 343 disposed within the interior of the housing 310 and about the set of circuit boards 320 and the set of ICs 330. The first set of EMI shields 341, the second set of EMI shields 342, and the third EMI shield, each is configured to shield harmonics of a primary frequency of a radio frequency (RF) wave generated by an RF source (e.g. the set of ICs 330, the set of circuit boards 320, and/or the like).

Figure 4:
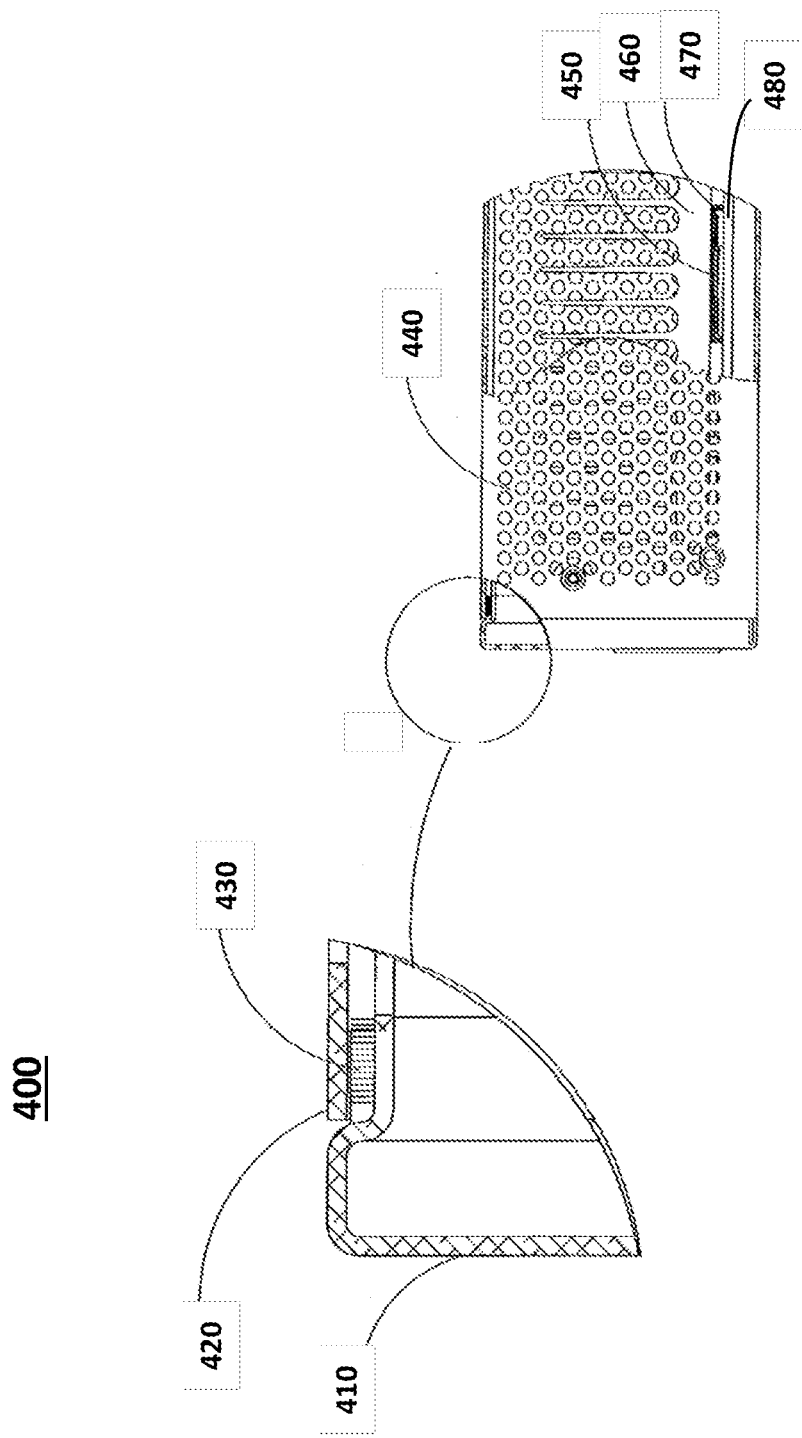
FIG. 4 is a schematic description of an integrated circuit shielding system, according to an embodiment.

FIG. 4 is a schematic description of an integrated circuit shielding system 400, according to an embodiment. Note the right portion of FIG. 4 shows a side view of the integrated circuit shield system 400 where the right half is shown in with cut-away to show RF source 450, shield portions 460 and 470, and circuit board 480. The integrated circuit shielding system 400 includes a radio frequency (RF) source 450 (e.g., an integrated circuit and/or a circuit board) disposed in the interior of the integrated circuit shielding system 400 that generates a set of radio frequency signals. The integrated circuit shielding system 400 includes a set of integrated circuits (not shown) mounted on a set of circuit boards (not shown), other than the RF source 450, that are also disposed in the interior of the integrated circuit shielding system 400. The integrated circuit shielding system 400 includes two electromagnetic interference (EMI) shields (also referred to herein as the 'layers of radio frequency filters') to shield the set of integrated circuits and the set of circuit boards from the RF source 450. The first EMI shield is defined collectively by shield portions 460 and 470, and is disposed about the RF source 450 on all sides but one, and can be mounted on a circuit board 480 from the set of circuit boards such that there is no intervening structure between the first EMI shield and the RF source 450. Therefore, the first EMI shield formed by shield portions 460 and 470 can be configured to filter primary frequencies originating from the RF source. (A second EMI shield is not shown in this embodiment but can be included in accordance with the other embodiments described here.) The third EMI shield is defined collectively by continuous ground plane 410, composite material 420, grounded material 430 and EMI shield 440, and disposed about the set of circuit boards included in the integrated circuit shielding system 400. The third EMI shield can define a continuous ground plane 410 by connecting, via a composite material 420 with or without metallic stands, to a grounded material 430. Moreover, the grounded material 430 can fill in a hole otherwise formed between the continuous ground plane 410 and the composite material 420. Such hole (if not filled with the grounded material 430) could otherwise be large enough to allow EMIs to propagate through. As such, the third EMI shield can be configured to eliminate residual resonant frequencies of the RF source. The third EMI shield can have a cutoff frequency $f_c$ that is based on a set of radii of a set of holes on the body of the EMI shield 440. On the other hand, the third EMI shield can serve as a catch-all electromagnetic filter with a broadband filtering response. In some instances, to achieve an excellent shielding performance against a set of harmonic EMIs, a longest dimension of the set of holes of the third EMI shield can be kept at or smaller than a fraction (e.g., 1/20, 1/50, and/or the like) of a wavelength of a smallest wavelength of the set of harmonic EMIs. Hence, the third EMI shield can be used in particular to eliminate harmonics of a primary frequency originated from the RF source.

Figure 5:
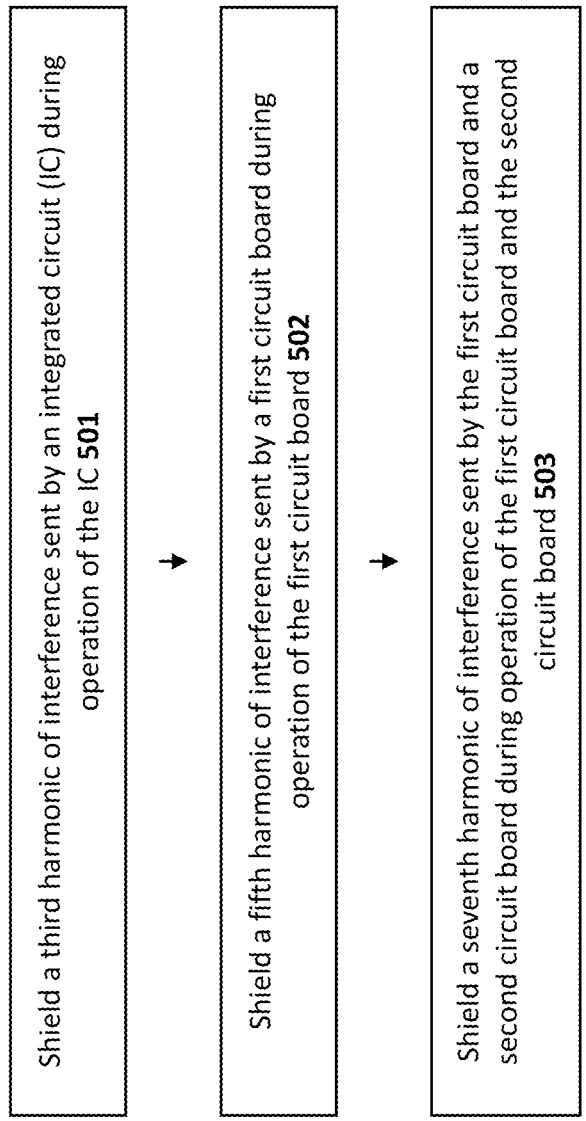
FIG. 5 is a flowchart of a method for shielding a set of electromagnetic interferences, according to an embodiment.

FIG. 5 is a flowchart of a method 500 for shielding a set of electromagnetic interferences (EMIs), according to an embodiment. The method 500 can be implemented/performed by an integrated circuit shielding system (similar to the integrated circuit shielding system 100 shown and described with respect to FIG. 1). At 501, the integrated circuit shielding system is configured to shield a third harmonic of interference sent by an integrated circuit (IC) (e.g., the IC 121 as shown and described with respect to FIG. 1) during operation of the IC. At 502, the integrated circuit shielding system is configured to shield a fifth harmonic of interference sent by a first circuit board (e.g., the circuit board 120 as shown and described with respect to FIG. 1) during operation of the first circuit board. At 503, the integrated circuit shielding system is configured to shield a seventh harmonic of interference sent by the first circuit board and a second circuit board during operation of the first circuit board and the second circuit board. Such shielding of the third harmonic of interference, a fifth harmonic of interference, and/or a seventh harmonic of interference can be achieved by a set of EMI shields of the integrated circuit shielding system having a set of holes with a size selected based on the third harmonic of interference, a fifth harmonic of interference, and/or a seventh harmonic of interference. Alternatively or in addition, the selective shielding can be achieved by configuring or optimizing the set of EMI shields with a thickness at or larger than an effective skin depth of the set of EMI shields, which is based on the third harmonic of interference, a fifth harmonic of interference, and/or a seventh harmonic of interference.

It should be understood that the disclosed embodiments are not representative of all claimed innovations. As such, certain aspects of the disclosure have not been discussed herein. That alternate embodiments may not have been presented for a specific portion of the innovations or that further undescribed alternate embodiments may be available for a portion is not to be considered a disclaimer of those alternate embodiments. Thus, it is to be understood that other embodiments can be utilized, and functional, logical, operational, organizational, structural and/or topological modifications may be made without departing from the scope of the disclosure. As such, all examples and/or embodiments are deemed to be non-limiting throughout this disclosure.

All definitions, as defined and used herein, should be understood to control over dictionary definitions, definitions in documents incorporated by reference, and/or ordinary meanings of the defined terms.

Examples of computer code include, but are not limited to, micro-code or micro-instructions, machine instructions, such as produced by a compiler, code used to produce a web service, and files containing higher-level instructions that are executed by a computer using an interpreter. For example, embodiments can be implemented using Python, Java, JavaScript, C++, and/or other programming languages and development tools. Additional examples of computer code include, but are not limited to, control signals, encrypted code, and compressed code.

The drawings primarily are for illustrative purposes and are not intended to limit the scope of the subject matter described herein. The drawings are not necessarily to scale; in some instances, various aspects of the subject matter disclosed herein can be shown exaggerated or enlarged in the drawings to facilitate an understanding of different features. In the drawings, like reference characters generally refer to like features (e.g., functionally similar and/or structurally similar elements).

Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements can optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements can optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method, comprising:
shielding a second electromagnetic (EM) wave sent by an integrated circuit (IC) that is included within a plurality of ICs of a first circuit board, the second EM wave having a harmonic of a radio frequency of a first EM wave generated by the IC;
shielding a third EM wave sent by the plurality of ICs of the first circuit board and not a second circuit board, the third EM wave having a harmonic of the radio frequency of the first EM wave; and
shielding a fourth EM wave sent by the first circuit board and the second circuit board, the fourth EM wave having a harmonic of the radio frequency of the first EM wave.

2. The method of claim 1, wherein a frequency of the harmonic of the third EM wave is greater than a frequency of the harmonic of the second EM wave, a frequency of the harmonic of the fourth EM wave is greater than the frequency of the harmonic of the third EM wave.

3. The method of claim 1, wherein:
the shielding the second EM wave sent by the IC includes not shielding each remaining IC from the plurality of ICs,
the first circuit board and the second circuit board being included within a plurality of circuit boards disposed within an interior of a housing and including a third circuit board,
the shielding of the fourth EM wave sent by the first circuit board and the second circuit board includes not shielding each remaining circuit board from the plurality of circuit boards.

4. The method of claim 1, wherein:
the first circuit board and the second circuit board disposed within an interior of a housing,
the shielding the second EM wave being performed within the interior of the housing, and
the shielding of the third EM wave being performed within the interior of the housing.

5. The method of claim 1, wherein:
the first circuit board and the second circuit board disposed within an interior of a housing,
the shielding the second EM wave being performed within the interior of the housing,
the shielding of the third EM wave being performed within the interior of the housing, and
the shielding of the fourth EM wave being performed within the interior of the housing.

6. The method of claim 1, wherein:
the shielding the second EM wave includes shielding the second EM wave according to a first band-pass response to shield a third harmonic of interference sent by the IC during operation of the IC and not a fifth harmonic of interference and not a seventh harmonic of interference sent by the IC during operation of the IC,
the shielding the third EM wave includes shielding the third EM wave according to a second band-pass response to shield a fifth harmonic of interference sent by the first circuit board during operation of the first circuit board and not a seventh harmonic of interference sent by the first circuit board during operation of the first circuit board, and
the shielding the fourth EM wave includes shielding the fourth EM wave according to a third band-pass response to shield a seventh harmonic of interference sent by the first circuit board and the second circuit board during operation of the first circuit board and the second circuit board.

7. The method of claim 1, wherein:
the shielding the second EM wave includes shielding the second EM wave according to a first band-pass response to shield a third harmonic of interference sent by the IC during operation of the IC and not a fifth harmonic of interference and not a seventh harmonic of interference sent by the IC during operation of the IC,
the shielding the third EM wave includes shielding the third EM wave according a second band-pass response to shield a fifth harmonic of interference and not a seventh harmonic of interference sent by the IC and each remaining IC from the plurality of ICs from the first circuit board during operation of the plurality of ICs from the first circuit board, and
the shielding the fourth EM wave includes shielding the fourth EM wave according to a third band-pass response to shield a seventh harmonic of interference sent by the IC, each remaining IC from the plurality of ICs from the first circuit board, and each IC from the plurality of ICs from the second circuit board, during operation of the plurality of ICs from a first circuit board and the plurality of ICs from the second circuit board.

8. The method of claim 1, wherein:
the shielding the second EM wave includes shielding the second EM wave according to a first band-pass response,
the shielding the third EM wave includes shielding the third EM wave according a second band-pass response,
the shielding the fourth EM wave includes shielding the fourth EM wave according to a third band-pass response,
the shielding the second EM wave, the shielding the third EM wave and the shielding the fourth EM wave collectively shields interference (1) of electronic components within an interior of a housing and (2) at frequencies less than and including a frequency associated with a seventh harmonic of the interference during operation of the electronic components within the interior of the housing.

9. The method of claim 1, wherein:
the shielding the third EM wave is performed by an electromagnetic interference (EMI) shield included within a Faraday cage that completely surrounds the first circuit board, and
the shielding the fourth EM wave is performed by an EMI shield included within a Faraday cage that includes an EMI gasket and that completely surrounds the first circuit board and the second circuit board.

10. The method of claim 1, wherein the shielding the second EM wave sent by the IC does not include shielding an EM wave generated by each remaining IC from the plurality of ICs of the first circuit board,
the method further comprising:
for each remaining IC from the plurality of ICs of the first circuit board, separately shielding the EM wave generated by that remaining IC; and
for each IC from a plurality of ICs of the second circuit board, separately shielding an EM wave generated by that IC from the plurality of ICs of the second circuit board.

11. The method of claim 1, wherein:
the first circuit board and the second circuit board being included within a plurality of circuit boards disposed within an interior of a housing and including a third circuit board,
the shielding of the third EM wave sent by the first circuit board includes not shielding each remaining circuit board from the plurality of circuit boards,
the method further comprising:
for each remaining circuit board from the plurality of circuit boards, separately shielding an EM wave generated by that remaining circuit board from the plurality circuit boards such that the plurality of circuit boards have a common ground.

12. A method, comprising:
shielding, according to a first cut-off frequency, a first electromagnetic (EM) wave by an integrated circuit (IC) of a circuit board from a plurality of circuit boards during operation of the IC;
shielding, according to a second cut-off frequency, a second EM wave sent by the circuit board during operation of the circuit board, the second cut-off frequency being higher than the first cut-off frequency; and
shielding, according to a third cut-off frequency, a third EM wave sent by the plurality of circuit boards during operation of the plurality of circuit boards, the third cut-off frequency being higher than the second cut-off frequency.

13. The method of claim 12, wherein:
the IC is included within a plurality of ICs of the circuit board,
the shielding the first EM wave sent by the IC includes not shielding each remaining IC from the plurality of ICs,
the shielding the second EM wave sent by the circuit board includes not shielding each remaining circuit board from the plurality of circuit boards.

14. The method of claim 12, wherein the plurality of circuit boards is disposed within an interior of a housing.

15. The method of claim 12, wherein:
the shielding the first EM wave, the shielding the second EM wave and the shielding the third EM wave collectively shields interference of electronic components within an interior of a housing.

16. The method of claim 12, wherein:
the plurality of circuit boards are disposed within an interior of a housing,
the shielding the first EM wave being performed within the interior of the housing, and
the shielding of the second EM wave being performed within the interior of the housing.

17. The method of claim 12, wherein:
the plurality of circuit boards are disposed within an interior of a housing,
the shielding the first EM wave being performed within the interior of the housing,
the shielding of the second EM wave being performed within the interior of the housing, and the shielding of the third EM wave being performed within the interior of the housing.

18. The method of claim 12, wherein:
the circuit board is a first circuit board, the plurality of circuit boards includes the first circuit board and a second circuit board,
the shielding the first EM wave includes shielding the first EM wave according to the first cut-off frequency to shield a third harmonic of interference sent by the IC during operation of the IC and not a fifth harmonic of interference and not a seventh harmonic of interference sent by the IC during operation of the IC,
the shielding the second EM wave includes shielding the second EM wave according to the second cut-off frequency to shield a fifth harmonic of interference sent by the first circuit board during operation of the first circuit board and not a seventh harmonic of interference sent by the first circuit board during operation of the first circuit board, and
the shielding the third EM wave includes shielding the third EM wave according to the third cut-off frequency to shield a seventh harmonic of interference sent by the first circuit board and the second circuit board during operation of the first circuit board and the second circuit board.

19. The method of claim 12, wherein:
the circuit board is a first circuit board, the plurality of circuit boards includes the first circuit board and a second circuit board, the IC is included within a plurality of ICs from the first circuit board,
the shielding the first EM wave is performed by a first EMI shield having a size and a shape to shield the first EM wave sent by the IC during operation of the IC,
the shielding the second EM wave is performed by a second EMI shield having a size and a shape to shield the second EM wave sent by each IC from the plurality of ICs from the first circuit board during operation of the plurality of ICs from the first circuit board, and the shielding the third EM wave is performed by a third EMI shield having a size and a shape to shield the third EM wave sent by the first circuit board and the second circuit board during operation of the first circuit board and the second circuit board.

20. The method of claim 12, wherein:

the circuit board is a first circuit board, the plurality of circuit boards includes the first circuit board and a second circuit board, the shielding the first EM wave is performed by a first EMI shield having a set of apertures sized and shaped to shield the first EM wave sent by the IC during operation of the IC, the shielding the second EM wave is performed by a second EMI shield having a set of apertures sized and shaped to shield the second EM wave sent by each IC from a plurality of ICs from the first circuit board during operation of the plurality of ICs from the first circuit board, and the shielding the third EM wave is performed by a third EMI shield having a set of apertures sized and shaped to shield the third EM wave sent by the first circuit board and the second circuit board during operation of the first circuit board and the second circuit board.

* * * * *